United States Patent
Hooker

(10) Patent No.: US 8,269,286 B2
(45) Date of Patent: Sep. 18, 2012

(54) COMPLEMENTARY SEMICONDUCTOR DEVICE WITH A METAL OXIDE LAYER EXCLUSIVE TO ONE CONDUCTIVITY TYPE

(75) Inventor: Jacob C. Hooker, Hamburg (DE)

(73) Assignee: NXP B.V., Eindhoven (NL)

( * ) Notice: Subject to any disclaimer, the term of this patent is extended or adjusted under 35 U.S.C. 154(b) by 484 days.

(21) Appl. No.: 12/519,160

(22) PCT Filed: Dec. 13, 2007

(86) PCT No.: PCT/IB2007/055086
§ 371 (c)(1),
(2), (4) Date: Jan. 27, 2010

(87) PCT Pub. No.: WO2008/072203
PCT Pub. Date: Jun. 19, 2008

(65) Prior Publication Data
US 2010/0176454 A1    Jul. 15, 2010

(30) Foreign Application Priority Data
Dec. 15, 2006  (GB) .................................. 0625004.7

(51) Int. Cl.
*H01L 27/092* (2006.01)
*H01L 21/8238* (2006.01)
(52) U.S. Cl. ........................................ 257/369; 438/199
(58) Field of Classification Search .................. 257/369, 257/388, 407, 412, 751; 438/199, 275, 592
See application file for complete search history.

(56) References Cited

U.S. PATENT DOCUMENTS

| 6,130,123 A | 10/2000 | Liang et al. |
| 6,166,417 A * | 12/2000 | Bai et al. ........................ 257/407 |
| 6,444,513 B1 | 9/2002 | Besser et al. |
| 2004/0106249 A1 * | 6/2004 | Huotari ........................... 438/216 |
| 2006/0006522 A1 * | 1/2006 | Doczy et al. ................... 257/702 |

FOREIGN PATENT DOCUMENTS

| WO | 2006/021906 A1 | 3/2006 |
| WO | 2006/021907 A | 3/2006 |
| WO | WO 2006021907 A1 * | 3/2006 |

* cited by examiner

*Primary Examiner* — Thomas L Dickey

(57) ABSTRACT

A method is provided of manufacturing a semiconductor device comprising a first, n-type field effect transistor (1) and a second, p-type field effect transistor (2). The method comprises depositing a gate dielectric layer over a substrate; depositing a gate metal layer (22) over the gate dielectric layer, depositing a solid metal oxide layer (15) over the gate dielectric layer; removing a portion of the solid metal oxide layer (15) over an area of the substrate corresponding to the n-type transistor; and completing gate stacks for the n-type and p-type transistors and forming source and drain regions. The invention thus provides a device which is compatible with IC technology and easy to manufacture. The deposition of a solid metal oxide layer provides a simplified manufacturing process, by avoiding the complexity of gas exposure to form an oxide layer.

23 Claims, 1 Drawing Sheet

Figure 1:
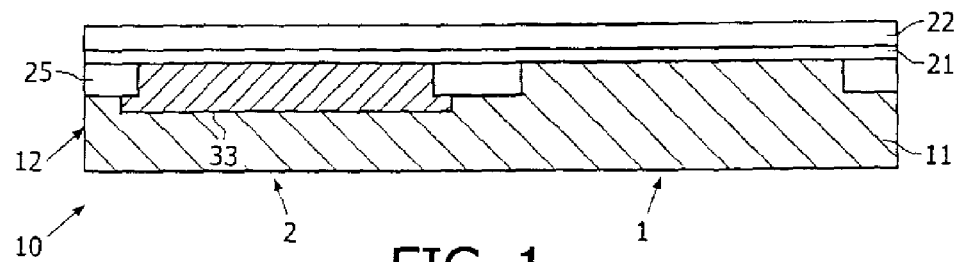

COMPLEMENTARY SEMICONDUCTOR DEVICE WITH A METAL OXIDE LAYER EXCLUSIVE TO ONE CONDUCTIVITY TYPE

This invention relates to semiconductor devices, and particularly to semiconductor devices in which field effect transistors of both conductivity types are integrated onto the same substrate. For example, the invention relates to CMOS circuits.

CMOS circuits comprise a first field effect transistor with a first source and drain region and a first channel of a first conductivity type. A first gate region is separated from the first channel by a first dielectric region. A second field effect transistor has a second source and drain region and a second channel of a second, opposite conductivity type to first conductivity type. A second gate region is separated from the second channel by a second dielectric region.

It is well known that the gate stack within the two different transistor types should be different, in particular so that the resulting work function of the gate is tailored to the particular transistor type. These differences need to be implemented with the least additional complexity to the CMOS processes.

The use of metal gates is well known, with the first gate region comprising a first conducting material, and the second gate region comprising a second conducting material different from the first conducting material. In some proposals, the first and second conducting materials each comprise a compound containing both a common metal and a further element. In advanced CMOS devices below the sub 0.1 micron region, this replacement of polysilicon gates by metal gates or alloys thereof is desirable for various reasons.

U.S. Pat. No. 6,130,123 discloses a CMOS structure with different metal materials for the gates of the NMOS and PMOS devices. Examples of metals or metal alloys that are suitable for NMOS devices, for which the work function is about 4.2 eV, are Ru, Zr, Nb, Ta, MoSi and TaSi. For PMOS devices, having a work function of about 5.2 eV, Ni, $RuO_2$, MoN and TaN are suitable material among others.

A drawback of the known conducting materials is that they are not always very compatible with existing IC technology. This includes the requirement that the materials should be compatible with the materials of the gate stack, namely the materials of the gate dielectric, the capping layer and the spacers.

WO2006/021907 discloses a structure and method in which the gate stacks of both device types include molybdenum or tungsten. The metal in the PMOS gate stack is exposed to oxygen to convert to a metal oxide, and the metal in the NMOS gate stack is subjected to an ion implantation of a chalcogenide such as tellurium. WO2006/021906 discloses a similar structure and method to WO2006/021907 in which the metal in the PMOS gate stack is exposed to oxygen to convert to a metal oxide, and the metal in the NMOS gate stack is exposed to a gaseous compound containing carbon.

While these processes provide gate metal work functions tailored to the particular transistor types, they still give rise to additional complexity in the manufacturing process.

According to the invention, there is provided a semiconductor device comprising:

a first, n-type field effect transistor with a first source and drain region and an n-type channel, and a first gate region separated from the n-type channel by a first dielectric region; and a second, p-type field effect transistor with a second source and drain region and a p-type channel, and a second gate region separated from the p-type channel by a second dielectric region, wherein the first gate region comprises a metal layer, and the second gate region comprises the metal layer and an overlying metal oxide layer, and wherein the metal oxide layer is present within the second gate region and not within the first gate region.

This device allows for a good coverage of the two relevant work functions in CMOS devices, namely 5.2 eV and 4.1 eV for PMOS and NMOS devices respectively.

The metal layer preferably comprises ruthenium (Ru), molybdenum (Mo), tungsten (W) or an alloy thereof. These can also be combined with Silicon (Si), carbon (C) and nitrogen (N) to form any combination of interstitial compound of silicide, carbide and/or nitride. These transition metals behave similarly, and all are compatible with present IC technology.

The portion of the metal layer within the first gate region may comprise an implanted chalcogenide, for example tellurium (Te).

In a preferred embodiment, Mo is chosen as the metal and Te is chosen as the chalcogenide. Good results are obtained with these elements. When Te is implanted into a Mo film, the work function of the resulting material is very close to 4.1 eV, and thus very suitable for use in an NMOS transistor.

The metal oxide layer preferably comprises a conducting metal oxide, for example an oxide of Ru, Mo or W or compound thereof. For example, molybdenum oxide, (particularly with an oxygen subscript of 2 or less), results in a work function material very close to 5.2 eV and thus is very suitable for use in a PMOS transistor.

Each gate region may further comprise a work function changing layer between the metal layer and the dielectric layer. This can be used to modify the work function of the gate, and it preferably has a thickness less than 10 nm. The work function changing layer may comprise of another transition metal and its compound such as TiN.

A cap layer is preferably provided on top of the first and second gate regions, for example a metal nitride.

The invention also provides a method of manufacturing a semiconductor device comprising a first, n-type field effect transistor with a first source and drain region and an n-type channel, and a first gate region separated from the n-type channel by a first dielectric region, and a second, p-type field effect transistor with a second source and drain region and a p-type channel, and a second gate region separated from the p-type channel by a second dielectric region, the method comprising:

preparing a substrate to have a semiconductor body of a first type and well of an opposite type;

depositing a gate dielectric layer over the substrate;

depositing a gate metal layer over the gate dielectric layer;

depositing a solid metal oxide layer over the gate dielectric layer;

removing a portion of the solid metal oxide layer over an area of the substrate corresponding to the n-type transistor; and completing gate stacks for the n-type and p-type transistors and forming source and drain regions, thereby to define one of the transistors over the semiconductor body and the other over the well.

The invention thus provides a device which is very compatible with IC technology and easy to manufacture. The deposition of a solid metal oxide layer provides a simplified manufacturing process, by avoiding the complexity of oxygen gas exposure.

A mask is preferably deposited over the metal oxide layer and is used for etching of the metal oxide layer to remove the portion of the solid metal oxide layer. This same mask can be used to implant a chalcogenide (e.g. tellurium) into the metal layer over an area of the substrate corresponding to the n-type transistor. This is used to alter the work function of the NMOS device gate.

A work function changing layer may be deposited on the dielectric layer before deposition of the metal layer, for example TiN to a thickness of less than 10 nm.

A cap layer is preferably deposited on top of the first and second gate regions, and acts as a barrier to silicon. The cap layer can be a metal nitride like titanium nitride. Other metal nitrides like a tantalum nitride could be used as well.

The present invention will now be described, by way of example only, with reference to the accompanying schematic drawings in which:

FIGS. 1 to 4 are sectional views of an example of a semiconductor device according to the invention at various stages in the manufacture of the device by means of an embodiment of a method in accordance with the invention.

The figures are diagrammatic and not drawn to scale, the dimensions in the thickness direction being particularly exaggerated for greater clarity. Corresponding parts are generally given the same reference numerals and the same hatching in the various figures.

FIGS. 1 through 4 show sectional views of an example of a semiconductor device according to the invention at various stages in the manufacture of the device by means of an embodiment of a method in accordance with the invention.

Figure 4:
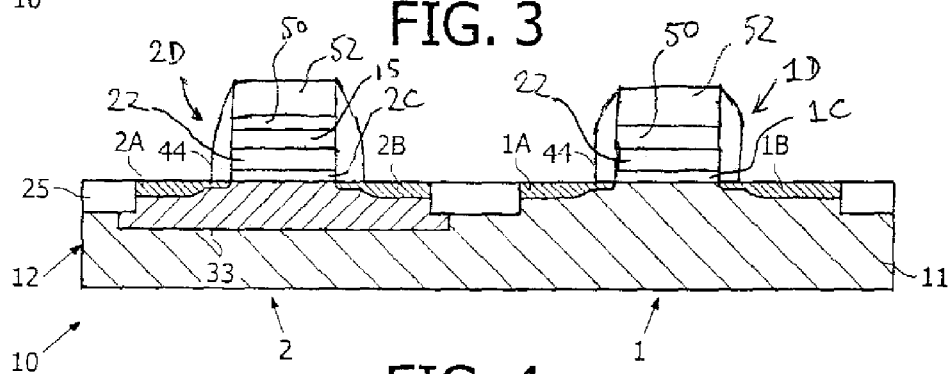

The (nearly) finished device 10 shown in FIG. 4 comprises a semiconductor body 12, in this example of p-type silicon and formed by a substrate 11. A first transistor 1 is formed as an NMOS transistor. In an N-well region 33, a second transistor 2 is formed as a PMOS transistor.

The transistors 1,2 comprise source and drain regions 1A,1B,2A,2B, respectively of p- and n-type conductivity, dielectric regions 1C,2C, for example silicon dioxide, and gate regions 1D,2D.

In the surface of the semiconductor body 12, isolation regions 25 are formed, in the form of shallow trench isolation (STI) regions filled with silicon dioxide (or with another gate dielectric, e.g. a metal oxide).

This invention relates specifically to the layers used and manufacturing method for the gate regions 1D, 2D. One example of the layers used is given below.

The gate region 1D of the NMOS transistor 1 comprises a metal layer 22 comprising Mo and Te and of which the work function is about 4.1 eV, very close to the optimal value of about 4.2 eV.

The gate region 2D of the PMOS transistor 2 comprises the same metal layer 22, but without the Te content. In addition, the PMOS device has a metal oxide layer 15, in particular molybdenum oxide (MoOx), for example $MoO_2$. The work function can be easily tuned to the optimal value of about 5.2 eV.

In addition, both gate regions comprise a region of TiN 50 or other cap layer, and poly silicon 52 on top of the work function materials.

The device 10 is manufactured as follows. The starting point of FIG. 1 is a p-type substrate 11 in which the n-well 33 and the STI (Shallow Trench Isolation) regions 25 are formed. Next, a dielectric layer 21 is formed and thereon the gate metal layer 22. In this example the gate metal layer is porous Mo, deposited by vapour deposition and with a thickness in the range of 5 to 20 nm.

Figure 2:
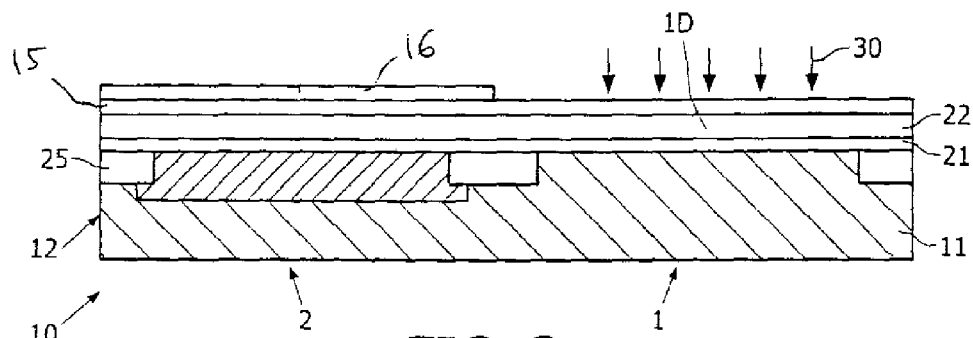

As shown in FIG. 2, a metal oxide layer 15 is deposited as a solid layer, for example by PVD or CVD-based method. The metal oxide layer in this example comprises molybdenum oxide.

The deposition from a solid has advantages over conventional oxygen gas exposure, since during an oxygen gas exposure process (such as an anneal in $O_2$) volatile components may be formed that could contaminate the annealing oven.

In the case of a solid deposited metal oxide, it can be encapsulated before the subsequent annealing steps.

Also, during gate stack etching for an $O_2$ exposure process, the metal oxide is a thin layer, and as this etches faster than the non-oxide, there can be problems etching into the silicon substrate.

Using a thicker metal oxide stack, the difference in etching rates for the two stacks can be balanced. Thus, there are a number of integration advantages in terms of compatibility and ease of providing clean processing.

A mask 16 is formed at the location of the PMOS transistor 2, as a photo resist layer for example 0.5 to 2 µm thick.

This mask 16 is used both to etch the metal oxide layer 15 to remove it from the gate stack of the NMOS device 1, but also subsequently to implant ions of tellurium into the metal layer 22 at the location of the NMOS device 1. The etching is to the underlying metal layer 22, and can be a wet or dry etching process. Arrows 30 represent the use of the mask 16 to etch the metal oxide layer 15 and to implant the tellurium ions, although these will of course be separate steps, and can be in either order. The tellurium ions are implanted with a flux in the range of $1-4\times10^{15}$ $cm^{-2}$ and with an implantation energy in the range of 10 to 20 keV.

Figure 3:
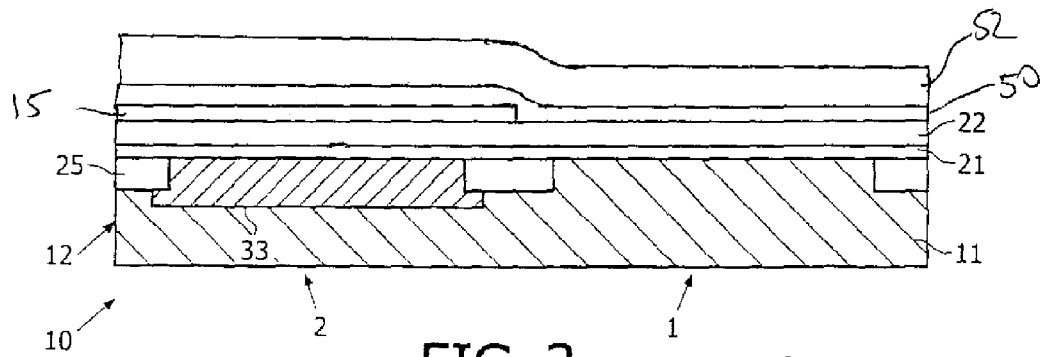

The resulting structure is covered with a capping layer 50, in this example TiN, and a polysilicon layer 52, as shown in FIG. 3.

The capping layer is generally of an electrically conducting material such as a metal nitride and is deposited uniformly onto the device 10. This material will block a reaction of the work function materials with the silicon deposited subsequently, and its presence in a gate stack is allowable because it is an electrically conducting material. Moreover, it protects the device against other exposures at moderate conditions.

The manufacturing is then continued in a usual manner in that gate stacks are formed by photolithography and etching. Formation of shallow parts of the source and drain regions 1A,1B,2A,2B is followed by the formation of spacers 44 and the deep source and drain implantations. Further steps like the deposition of pre-metal dielectric, patterning thereof, contact metal deposition and patterning thereof are not shown in the Figures.

The device 10 is subjected to a thermal annealing step, e.g. a spike anneal in a nitrogen atmosphere and at a temperature in the range of 700 to 1050 degrees Celsius.

The example above uses Tellurium implantation to alter the work function of the NMOS device. It will be understood that this is not an essential step, as the gate characteristics may be sufficient without requiring this step. Tellurium is preferred, but other chalcogenides may be used. The implantation uses the etching mask in the example above, but the implantation can be at other stages in the process (for example to the structure shown in FIG. 3) with alternative masking of the PMOS active area.

An additional cap layer may also be provided above the metal oxide layer 15 and below the mask 16. This can be used to control the implantation process, in particular to prevent implantation to the depth of the gate dielectric, and to act as an encapsulation/barrier layer. A TiN layer can be used, for example 5 to 20 nm thick. Preferably, the capping layer is a metal layer with less oxygen affinity than the metal in the metal layer. This assists in the diffusion of the oxygen to the layers below the metal oxide layer.

The metal layer may generally comprise Ru, Mo, W or an alloy thereof.

The metal oxide layer may generally comprises a conducting metal oxide, for example an oxide of Ru, Mo or W.

Although not shown in the drawings, an additional work function changing layer can be provided between the metal layer and the dielectric layer. This is preferably an ultra thin metal layer such as TiN (less than 5 nm). More generally, any dielectric material can be used which will alter the work function in a desired way. This layer can also provide oxygen barrier properties to minimize oxide growth.

The dielectric layer can be standard $SiO_2$ or SiON or other high dielectric constant material.

The invention can provide the desired significant changes in work function, such that the resultant work functions match those of n- and p-type silicon. Preferably, the work functions should be within +0.2 eV of the valence band edge and −0.2 eV of the conduction band edges of silicon, namely 4.1 to 4.3 eV for n-type and 5.0 to 5.2 eV for p-type.

The main application is for CMOS devices, but other semiconductor devices with both types of device on a common substrate can benefit from the invention, such as bipolar and bicmos technologies, and for a range of applications, such as memories (MIM—Metal-Insulator-Metal, DRAM—Dynamic RAM, NVM—Non-volatile memory), ND and D/A converters, RF circuitry etc.

It will be obvious that the invention is not limited to the examples described herein, and that within the scope of the invention many variations and modification are possible to those skilled in the art. It is for example in order to fine tune the work functions, traces of other elements can be introduced into the conducting materials. Also a mixture of elements like Se and Te can be used for that purpose.

The invention claimed is:

1. A semiconductor device comprising:
a first, n-type field effect transistor with a first source and drain region and an n-type channel, and a first gate region separated from the n-type channel by a first dielectric region; and
a second, p-type field effect transistor with a second source and drain region and a p-type channel, and a second gate region separated from the p-type channel by a second dielectric region,
wherein the first gate region comprises a first number of layers inclusive of a metal layer, and the second gate region comprises a second number of layers inclusive of the metal layer and an overlying metal oxide layer, and wherein the metal oxide layer is present within the second gate region and not within the first gate region, and the second number of layers in the second gate region is different than the first number of layers in the first gate region.

2. A device as claimed in claim 1, wherein the metal layer comprises Ru, Mo, W or an alloy thereof.

3. A device as claimed in claim 1, wherein the portion of the metal layer within the first gate region comprises an implanted chalcogenide.

4. A device as claimed in claim 3, wherein the chalcogenide is a compound comprising tellurium.

5. A device as claimed in claim 1, wherein the metal oxide layer comprises a conducting metal oxide.

6. A device as claimed in claim 5, wherein the conducting metal oxide comprises an oxide of Ru, Mo or W.

7. A device as claimed in claim 1, wherein each gate region further comprises a work function changing layer between the metal layer and the dielectric layer.

8. A device as claimed in claim 7, wherein the work function changing layer has a thickness less than 5 nm.

9. A device as claimed in claim 8, wherein the work function changing layer comprises TiN.

10. A device as claimed in claim 1, further comprising a cap layer on top of the first and second gate regions.

11. A device as claimed in claim 10, wherein the cap layer comprises a metal nitride.

12. A method of manufacturing a semiconductor device comprising a first, n-type field effect transistor with a first source and drain region) and an n-type channel, and a first gate region separated from the n-type channel by a first dielectric region, and a second, p-type field effect transistor (2) with a second source and drain region and a p-type channel, and a second gate region separated from the p-type channel by a second dielectric region, the method comprising:
preparing a substrate to have a semiconductor body of a first type and well of an opposite type;
depositing a gate dielectric layer over the substrate;
depositing a gate metal layer over the gate dielectric layer;
depositing a solid metal oxide layer over the gate dielectric layer;
removing a portion of the solid metal oxide layer over an area of the substrate corresponding to the n-type transistor; and
completing gate stacks for the n-type and p-type transistors and forming source and drain regions, thereby to define one of the transistors over the semiconductor body and the other over the well, and to further define a different number of layers in each of the gate stacks for the n-type and the p-type transistors.

13. A method as claimed in claim 12, wherein the metal layer comprises Ru, Mo, W or an alloy thereof.

14. A method as claimed in claim 12, wherein a mask is deposited over the metal oxide layer and is used for etching of the metal oxide layer to remove the portion of the solid metal oxide layer.

15. A method as claimed in claim 12, further comprising implanting a chalcogenide into the metal layer over an area of the substrate corresponding to the n-type transistor.

16. A method as claimed in claim 15, wherein the mask is also used as a shield for the implantation.

17. A method as claimed in claim 15 wherein the chalcogenide is a compound comprising tellurium.

18. A method as claimed in claim 12, wherein the metal oxide layer comprises a conducting metal oxide.

19. A method as claimed in claim 18, wherein the conducting metal oxide comprises an oxide of Ru, Mo or W.

20. A method as claimed in claim 12, further comprising depositing a work function changing layer on the dielectric layer before deposition of the metal layer.

21. A method as claimed in claim 20, wherein the work function changing layer is deposited to a thickness of less than 5 nm.

22. A method as claimed in claim 21, wherein the work function changing layer comprises TiN.

23. A method as claimed in claim 12, wherein completing the gate stacks comprises depositing a cap layer on top of the first and second gate regions.

* * * * *